(12) United States Patent
Takada et al.

(10) Patent No.: US 9,391,468 B2
(45) Date of Patent: Jul. 12, 2016

(54) RESONANCE-TYPE NON-CONTACT POWER SUPPLY SYSTEM, AND ADJUSTMENT METHOD FOR MATCHING UNIT DURING CHARGING OF RESONANCE-TYPE NON-CONTACT POWER SUPPLY SYSTEM

(75) Inventors: Kazuyoshi Takada, Kariya (JP); Sadanori Suzuki, Kariya (JP); Shimpei Sakoda, Kariya (JP); Yukihiro Yamamoto, Kariya (JP); Shinji Ichikawa, Toyota (JP); Toru Nakamura, Toyota (JP)

(73) Assignees: Kabushiki Kaisha Toyota Jidoshokki (JP); Toyota Jidosha Kabushiki Kaisha (JP)

( * ) Notice: Subject to any disclaimer, the term of this patent is extended or adjusted under 35 U.S.C. 154(b) by 759 days.

(21) Appl. No.: 13/697,737

(22) PCT Filed: May 12, 2011

(86) PCT No.: PCT/JP2011/060940
§ 371 (c)(1),
(2), (4) Date: Dec. 12, 2012

(87) PCT Pub. No.: WO2011/142417
PCT Pub. Date: Nov. 17, 2011

(65) Prior Publication Data
US 2013/0193913 A1    Aug. 1, 2013

(30) Foreign Application Priority Data

May 14, 2010 (JP) ................................ 2010-112095

(51) Int. Cl.
*H02J 7/00* (2006.01)
*H02J 7/02* (2016.01)
(Continued)

(52) U.S. Cl.
CPC ............... *H02J 7/025* (2013.01); *B60L 11/182* (2013.01); *B60L 11/1833* (2013.01); *H02J 5/005* (2013.01);
(Continued)

(58) Field of Classification Search
USPC ......................................................... 320/108
See application file for complete search history.

(56) References Cited

U.S. PATENT DOCUMENTS

| 8,204,531 B2 | 6/2012 | Jin et al. |
| 2006/0071632 A1 | 4/2006 | Ghabra et al. |

(Continued)

FOREIGN PATENT DOCUMENTS

| CN | 101313634 | 11/2008 |
| CN | 201230219 | 4/2009 |

(Continued)

OTHER PUBLICATIONS

U.S. Appl. No. 13/697,677: Notice of Allowance, dated Jun. 12, 2015, 5 pages.

(Continued)

*Primary Examiner* — Robert Grant
(74) *Attorney, Agent, or Firm* — Baker & Hostetler LLP

(57) ABSTRACT

Power supply equipment (10) is provided with an AC power supply (11) and a primary-side resonance coil (13b). Movable body equipment (20) is provided with a secondary-side resonance coil (21b), which receives power from the primary-side coil, a rectifier (23), which rectifies the received power, a charger (24) to which the rectified power is supplied, and a secondary battery (25), which is connected to the charger. A primary matching unit (12) is provided between the AC power supply (11) and the primary-side resonance coil (13b). A secondary matching unit (22) is provided between the secondary-side resonance coil (21b) and the rectifier (23). A control unit is provided to either the power supply equipment (10) or the movable body equipment (20). The control unit controls a primary matching unit adjustment unit (14) and a secondary matching unit adjustment unit (26). In order to efficiently transfer power from the primary side to the secondary side when charging the secondary battery, the control unit initially adjusts the secondary matching unit (22). After adjusting the secondary matching unit (22), the control unit adjusts the first matching unit (12).

7 Claims, 1 Drawing Sheet

(51) Int. Cl.
*H02J 5/00* (2016.01)
*H04B 5/00* (2006.01)
*B60L 11/18* (2006.01)
*H03H 7/40* (2006.01)

(52) U.S. Cl.
CPC ........... *H04B 5/0037* (2013.01); *B60L 2210/10* (2013.01); *B60L 2210/30* (2013.01); *B60L 2210/40* (2013.01); *H03H 7/40* (2013.01); *Y02T 10/7005* (2013.01); *Y02T 10/7072* (2013.01); *Y02T 10/7216* (2013.01); *Y02T 10/7241* (2013.01); *Y02T 90/12* (2013.01); *Y02T 90/121* (2013.01); *Y02T 90/122* (2013.01); *Y02T 90/125* (2013.01); *Y02T 90/127* (2013.01); *Y02T 90/14* (2013.01)

(56) References Cited

U.S. PATENT DOCUMENTS

| | | |
|---|---|---|
| 2007/0103650 A1 | 5/2007 | Takagi et al. |
| 2008/0197804 A1 | 8/2008 | Onishi et al. |
| 2009/0058190 A1 | 3/2009 | Tanaka |
| 2009/0066440 A1 | 3/2009 | Chan Wai Po et al. |
| 2009/0127937 A1 | 5/2009 | Widmer et al. |
| 2009/0174364 A1 | 7/2009 | Onishi et al. |
| 2010/0013320 A1 | 1/2010 | Shiozaki et al. |
| 2010/0052431 A1* | 3/2010 | Mita ............ B60L 11/182 307/104 |
| 2010/0225271 A1* | 9/2010 | Oyobe ............ B60L 5/005 320/108 |
| 2011/0049995 A1* | 3/2011 | Hashiguchi ......... H02J 7/025 307/104 |
| 2011/0053500 A1 | 3/2011 | Menegoli et al. |
| 2011/0241440 A1 | 10/2011 | Sakoda et al. |
| 2012/0176085 A1 | 7/2012 | Iida et al. |
| 2013/0057082 A1 | 3/2013 | Takada et al. |
| 2013/0057208 A1 | 3/2013 | Takada et al. |
| 2013/0193913 A1 | 8/2013 | Takada et al. |

FOREIGN PATENT DOCUMENTS

| | | |
|---|---|---|
| EP | 2031729 A2 | 3/2009 |
| EP | 2290782 | 7/2010 |
| JP | 11-188113 | 7/1999 |
| JP | 2000-287369 | 10/2000 |
| JP | 2001-238372 | 8/2001 |
| JP | 2002-064403 | 2/2002 |
| JP | 2006-115592 | 4/2006 |
| JP | 2006-230032 | 8/2006 |
| JP | 2009-106136 | 5/2009 |
| JP | 2009-118587 | 5/2009 |
| JP | 2010-028937 | 2/2010 |
| JP | 2010-063245 | 3/2010 |
| JP | 2010-68634 | 3/2010 |
| JP | 2010-074937 | 4/2010 |
| JP | 2010-141977 | 6/2010 |
| JP | 2011-050140 | 3/2011 |
| WO | WO 2008/038203 A2 | 4/2008 |
| WO | WO 2010/035321 | 4/2010 |
| WO | WO 2010/036980 A1 | 4/2010 |
| WO | WO 2010/067763 | 6/2010 |
| WO | WO 2011/142417 | 11/2011 |
| WO | WO 2011/142418 | 11/2011 |
| WO | WO 2011/142419 | 11/2011 |
| WO | WO 2011/142420 | 11/2011 |

OTHER PUBLICATIONS

U.S. Appl. No. 13/697,677: Non-Final Office Action dated Mar. 3, 2015, 7 pages.
U.S. Appl. No. 13/697,662: Non-Final Office Action dated Jan. 14, 2016, 17 pages.
European Patent Application No. 11780677.8-1809/2571134: Supplementary European Search Report dated Mar. 1, 2016, 8 pages.
Machine Translation of Japanese Publication No. 2010-68634 entitled "Wireless Charging System for Vehicle", Mar. 25, 2010, 20 pages.

* cited by examiner

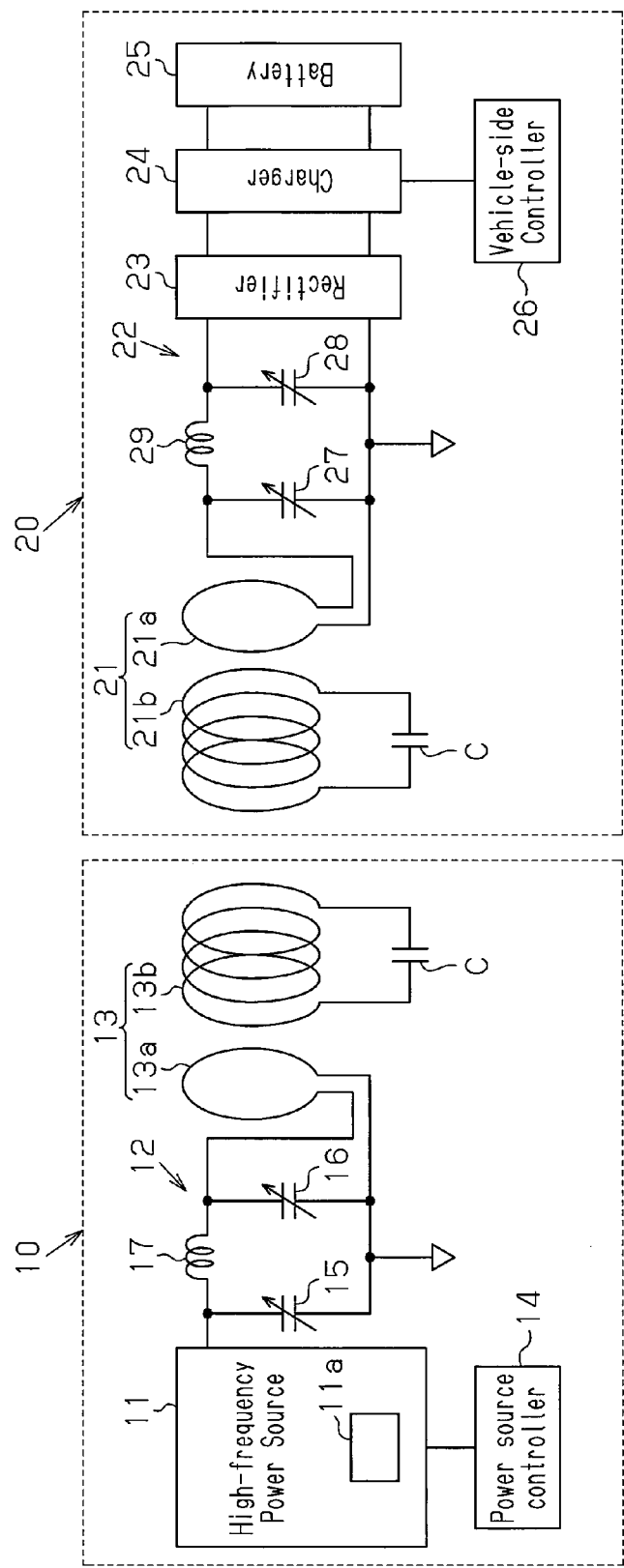

RESONANCE-TYPE NON-CONTACT POWER SUPPLY SYSTEM, AND ADJUSTMENT METHOD FOR MATCHING UNIT DURING CHARGING OF RESONANCE-TYPE NON-CONTACT POWER SUPPLY SYSTEM

CROSS-REFERENCE TO RELATED APPLICATIONS

This application is the National Stage of International Application No. PCT/JP2011/060940, filed May 12, 2011, which claims the benefit of Japanese Application No. 2010-112095, filed May 14, 2010, the disclosures of which are incorporated herein by reference in their entireties.

FIELD OF THE INVENTION

The present invention relates to a resonance type non-contact power supply system and a method for adjusting a matching unit of the resonance type non-contact power supply system for when the system performs charging. Specifically, the invention relates to a resonance type non-contact power supply system including matching units, which are variable impedance matching means, on both the power supply side and the power reception side. The invention relates also to a method for adjusting a matching unit of the resonance type non-contact power supply system for when the system performs charging.

BACKGROUND OF THE INVENTION

To supply electric power from an AC power source to a load efficiently, a resonance type non-contact power supply system must transmit the electric power from the AC power source efficiently to a resonance system. If the resonance type non-contact power supply system has a constant distance between the power supply side (the primary side) and the power reception side (the secondary side) and the load connected to the power reception side is invariable, a test is conducted initially to determine the output frequency of the AC power source, which is the resonance frequency of the resonance system. The AC power source outputs AC voltage to a primary coil at the obtained output frequency.

However, if the distance between the resonance coils varies or impedance changes in the load, the input impedance of the resonance system at the resonance frequency of the resonance system also changes. This hampers matching between the AC power source and the input impedance of the resonance system, thus increasing the reflected electric power to the AC power source. In other words, the load cannot receive the electric power efficiently.

When the resonance type non-contact power supply system is used to charge a battery, the load varies in correspondence with the charging state of the battery. This also changes the input impedance of the resonance system, resulting in increase in the reflected electric power to the AC power source.

One such conventionally proposed power transmission system improves efficiency for electric power transmission in a wide range of communicability distances for a non-contact IC card system performing electric power transmission and signal communication by electromagnetic induction (see Patent Document 1). The power transmission system of Patent Document 1 includes a set of an electromagnetic field generating device and an electromagnetic field receiving device, which perform electric power transmission and signal communication by electromagnetic induction. At least one of the electromagnetic field generating means of the electromagnetic field generating device and the electromagnetic field receiving means of the electromagnetic field receiving device includes variable impedance matching means for variably controlling input-output impedance and control means for controlling the variable impedance matching means. The control means controls the input-output impedance of the variable impedance matching means to match impedance between the electromagnetic field generating device and the electromagnetic field reception device. This increases the electric power received by the electromagnetic field receiving device, according to Patent Document 1.

PRIOR ART DOCUMENT

Patent Document

Patent Document 1: Japanese Laid-Open Patent Publication No. 2001-238372

SUMMARY OF THE INVENTION

Problems that the Invention is to Solve

When a resonance type non-contact power supply system including matching units on both the power supply side (the primary side) and the power reception side (the secondary side) is employed to charge a secondary battery (a battery) on the power reception side, load varies in correspondence with the charging state of the battery. Since such load variation changes the input impedance of the resonance system, it is necessary to adjust the matching units on both the power supply side and the power reception side before battery charging. If a rectifier for rectifying the AC electric power supplied from the power supply side to the power reception side in a non-contact manner is arranged on the power reception side, there may be cases in which the power reception side matching unit and the rectifier are not matched. In these cases, even though the power source and the coil on the primary side are matched, electric power transmission from the primary side to the secondary side cannot be performed efficiently.

Accordingly, it is an objective of the present invention to provide a resonance type non-contact power supply system that has matching units on both a power supply side and a power reception side and transmits electric power from the power supply side to the power reception side efficiently when the system charges a load. It is another objective of the invention to provide a method for adjusting the matching units of the resonance type non-contact power supply system for when the system performs charging.

Means for Solving the Problems

To achieve the foregoing objective and in accordance with one aspect of the present invention, a resonance type non-contact power supply system is provided that includes a power supply equipment and movable body equipment. The power supply system includes an AC power source and a primary-side resonance coil for receiving electric power from the AC power source. The movable body equipment includes a secondary-side resonance coil for receiving the electric power from the primary-side resonance coil, a rectifier for rectifying the electric power received by the secondary-side resonance coil, a charger to which the electric power rectified by the rectifier is supplied, and a secondary battery connected to the charger. The power supply equipment further includes a primary matching unit arranged between the AC power source and the primary-side resonance coil and a primary matching unit adjusting section for adjusting the primary matching unit. The movable body equipment further includes a secondary matching unit arranged between the secondary-side resonance coil and the rectifier and a secondary matching unit adjusting section for adjusting the secondary matching unit. The resonance type non-contact power supply system also includes a control section mounted in one of the power supply equipment and the movable body equipment. The control section controls the primary matching unit adjusting section and the secondary matching unit adjusting section such that, when the secondary battery is charged, the secondary matching unit is adjusted first and then the primary matching unit is adjusted after the secondary matching unit is adjusted.

If the secondary battery is mounted in a movable body (for example, a vehicle), the SOC (the state of charge) of the secondary battery at the start of charging is not constant. Also, the movable body is not always accurately stopped at a charging position for efficient non-contact electric power supply from the power supply equipment to the movable body equipment. This makes it necessary to adjust the primary matching unit of the power supply equipment and the secondary matching unit of the movable body equipment prior to charging. In adjustment of the primary matching unit, if the output of the AC power source increases before matching is accomplished between the secondary-side resonance coil and the rectifier, electric power cannot be supplied efficiently to the secondary side. This increases the reflected electric power from the secondary side to the primary side.

To solve this problem, in the present invention, the secondary matching unit is adjusted first before the secondary battery is charged. After adjustment of the secondary matching unit, the primary matching unit is adjusted. Specifically, in adjustment of the secondary matching unit, the reflected electric power from the secondary side to the primary side is great before completion of the adjustment of the secondary matching unit, or, in other words, before matching is accomplished between the secondary-side resonance coil and the rectifier. However, for example, if the reflected electric power is great, the secondary matching unit may be adjusted with the output of the AC power source maintained low to decrease loss in the electric power transmission at the time when the secondary matching unit is adjusted. Then, the primary matching unit is adjusted after the secondary matching unit is adjusted. This ensures efficient electric power transmission from the coil on the primary side to the coil on the secondary side.

The control section preferably controls the AC power source and the secondary matching unit adjusting section such that, when the secondary matching unit is adjusted, adjustment of the secondary matching unit is started with an output of the AC power source maintained less than an output at the start of charging, and then the output of the AC power source is increased to the output at the start of charging of the secondary battery in multiple steps.

According to the present invention, the control section adjusts the secondary matching unit in a plurality of steps by increasing the electric power output from the AC power source gradually from a low level to a high level. Finally, the control section adjusts the secondary matching unit at the electric power output for charging. This decreases the amount of the electric power inefficiently transmitted from the primary-side coil to the secondary-side coil before the steps of adjustment of the secondary matching unit are completed. As a result, according to the invention, the control section efficiently transmits the electric power from the primary-side coil to the secondary-side coil, compared to, for example, a case where adjustment of the secondary matching unit is performed while the electric power output from the AC power source is maintained at the output level at the start of charging.

The control section is preferably mounted in the movable body equipment. Each of the matching units is preferably a π-type matching unit including two variable capacitors and an inductor arranged between the variable capacitors. The movable body is a vehicle.

In accordance with another aspect of the present invention, a method for adjusting a matching unit when a resonance type non-contact power supply system performs charging is provided. The resonance type non-contact power supply system has power supply equipment and movable body equipment. The power supply equipment includes an AC power source, a primary-side resonance coil, and a primary matching unit. The movable body equipment includes a secondary-side resonance coil for receiving electric power from the primary-side resonance coil, a secondary matching unit, a rectifier for rectifying the electric power received by the secondary-side resonance coil, a charger to which the electric power rectified by the rectifier is supplied, and a secondary battery connected to the charger. The method includes, when the secondary battery is charged, adjusting the secondary matching unit first and then adjusting the primary matching unit after the secondary matching unit is adjusted. According to the present invention, the primary matching unit is adjusted after the secondary matching unit. This ensures efficient electric power transmission from the primary side to the secondary side, compared to, for example, a case where the primary matching unit is adjusted before adjustment of the secondary matching unit is completed.

Preferably, the primary matching unit and the secondary matching unit are each a π-type matching unit including two variable capacitors and an inductor arranged between the capacitors. The method further includes adjusting the primary matching unit and the secondary matching unit by adjusting the capacity of the variable capacitors.

Effects of the Invention

The present invention provides a resonance type non-contact power supply system that has matching units on both a power supply side and a power reception side and transmits electric power efficiently from the power supply side to the power reception side when charging a load. The invention also provides a method for adjusting the matching units of the resonance type non-contact power supply system for when the system performs charging.

BRIEF DESCRIPTION OF THE DRAWING

FIG. 1 is a diagram representing the configuration of a resonance type non-contact power supply system according to one embodiment.

DETAILED DESCRIPTION OF THE PREFERRED EMBODIMENTS

FIG. 1 illustrates a resonance type non-contact power supply system for charging a battery mounted in a vehicle according to a first embodiment of the present invention.

With reference to FIG. 1, the resonance type non-contact power supply system has power supply equipment 10 and movable body equipment 20. The power supply equipment 10 is power supply side equipment (power transmission side equipment), which is installed on the ground. The movable body equipment 20 is movable body side equipment, which is mounted in a vehicle serving as a movable body.

The power supply equipment 10 includes a high-frequency power source 11, a primary matching unit 12, a primary coil device 13, and a power source controller 14. The high-frequency power source 11 receives a power source ON/OFF signal from the power source controller 14 serving as a power source side controller. The high-frequency power source 11 is turned on or off in response to the signal. The high-frequency power source 11 outputs AC electric power of the frequency equal to the pre-set resonance frequency of a resonance system arranged in the resonance type non-contact power supply system, which is a high-frequency electric power of approximately several MHz.

The primary coil device 13 serving as a primary-side coil is configured by a primary coil 13a and a primary-side resonance coil 13b. The primary coil 13a is connected to the high-frequency power source 11 through the primary matching unit 12. The primary coil 13a and the primary-side resonance coil 13b are arranged coaxial with each other. A capacitor C is connected to the primary-side resonance coil 13b in parallel. The primary coil 13a is connected to the primary-side resonance coil 13b by electromagnetic induction. The AC electric power supplied from the high-frequency power source 11 to the primary coil 13a is fed to the primary-side resonance coil 13b by electromagnetic induction.

The primary matching unit 12, which serves as a primary-side matching unit, is configured by two primary variable capacitors 15, 16 each serving as a variable reactance and a primary inductor 17. The primary variable capacitor 15 is connected to the high-frequency power source 11 and the primary variable capacitor 16 is connected to the primary coil 13a in parallel. The primary inductor 17 is arranged between the primary variable capacitors 15 and 16. The capacity of each of the primary variable capacitors 15, 16 is changed to change impedance of the primary matching unit 12. A non-illustrated rotary shaft of each primary variable capacitor 15, 16, for example, is configured to be driven by a motor in a publicly known manner. Specifically, when the motor is actuated in response to a drive signal from the power source controller 14, the capacity of each primary variable capacitor 15, 16 is changed. In other words, the power source controller 14 functions as primary matching unit adjusting means (a primary matching unit adjusting section).

The movable body equipment 20 includes a secondary coil device 21, a secondary matching unit 22, a rectifier 23, a charger 24, a secondary battery (a battery) 25 connected to the charger 24, and a vehicle-mounted controller 26. The vehicle-mounted controller 26 serving as a vehicle side controller receives a detection signal from a non-illustrated detecting section (an SOC (State Of Charge) detecting section), which detects the state of charge (SOC) of the secondary battery 25. Using the detection signal, the controller 26 determines the SOC of the secondary battery 25.

The secondary coil device 21 serving as a secondary-side coil is configured by a secondary coil 21a and a secondary-side resonance coil 21b. The secondary coil 21a and the secondary-side resonance coil 21b are arranged coaxial with each other. Another capacitor C, which is different from the capacitor C for the primary-side resonance coil 13b, is connected to the secondary-side resonance coil 21b. The secondary coil 21a is connected to the secondary-side resonance coil 21b by electromagnetic induction. The AC electric power supplied from the primary-side resonance coil 13b to the secondary-side resonance coil 21b through resonance is fed to the secondary coil 21a by electromagnetic induction. The secondary coil 21a is connected to the secondary matching unit 22.

The number of turns and winding diameter of each one of the primary coil 13a, the primary-side resonance coil 13b, the secondary-side resonance coil 21b, and the secondary coil 21a are determined as needed in correspondence with the level of the electric power to be supplied (transmitted) from the power supply equipment 10 to the movable body equipment 20.

In the first embodiment, the primary matching unit 12, the primary coil 13a, the primary-side resonance coil 13b, the secondary-side resonance coil 21b, the secondary coil 21a, the secondary matching unit 22, the rectifier 23, the charger 24, and the secondary battery 25 configure a resonance system.

The secondary matching unit 22, which serves as a secondary side matching unit, is configured by two secondary variable capacitors 27, 28, each of which serves as a variable reactance, and a secondary inductor 29. The secondary inductor 29 is arranged between the secondary variable capacitors 27 and 28. The secondary variable capacitor 27 is connected to the secondary coil 21a in parallel and the secondary variable capacitor 28 is connected to the rectifier 23. The capacity of each of the secondary variable capacitors 27, 28 is changed to change the impedance of the secondary matching unit 22. Each secondary variable capacitor 27, 28 has a publicly known configuration in which, for example, a non-illustrated rotary shaft is driven by a motor, which is actuated in response to a drive signal from the vehicle-mounted controller 26. In other words, the vehicle-mounted controller 26 functions as secondary matching unit adjusting means (a secondary matching unit adjusting section).

The vehicle-mounted controller 26 has a vehicle-mounted CPU and a vehicle-mounted memory. The vehicle-mounted memory stores data representing the relationship between the SOC of the secondary battery 25 in the state where the vehicle is stopped accurately at a predetermined stop position in the power supply equipment 10 to charge the secondary battery 25 and the capacity of each secondary variable capacitor 27, 28 of the secondary matching unit 22 in the state where the secondary-side resonance coil 21b is matched with the rectifier 23 in the aforementioned SOC of the secondary battery 25 as a map or an expression.

The vehicle-mounted controller 26 functions also as control means (a control section) for controlling the primary matching unit adjusting section and the secondary matching unit adjusting section such that, when the secondary battery 25 is charged, the secondary matching unit 22 is first adjusted and then the primary matching unit 12 is adjusted after adjustment of the secondary matching unit 22. Specifically, the power source controller 14 and the vehicle-mounted controller 26 are allowed to communicate with each other through a non-illustrated wireless communication device. After the vehicle is stopped at the predetermined stop position in the power supply equipment 10 to charge the secondary battery 25, the vehicle-mounted controller 26 serving as the control section wirelessly informs the power source controller 14 that the vehicle-mounted controller 26 is to adjust the secondary matching unit 22. After adjustment of the secondary matching unit 22 is completed, the power source controller 14 receives a command signal for adjustment of the primary matching unit 12 from the vehicle-mounted controller 26 and then adjusts the primary matching unit 12. When adjustment of the primary matching unit 12 is completed, the power source controller 14 informs the vehicle-mounted controller 26 that the power source controller 14 is to start electric power transmission. The power source controller 14 then starts to transmit the electric power for charging.

(Operation)

Operation of the resonance type non-contact power supply system, which is configured as described above, will hereafter be described.

When the secondary battery 25, which is mounted in the vehicle, is charged, the SOC (the state of charge) of the secondary battery at the start of charging is not always the same. Also, there may be cases in which the vehicle cannot be stopped at a charging position for ensuring efficient non-contact power supply from the power supply equipment 10 to the movable body equipment 20. Accordingly, the primary matching unit 12 and the secondary matching unit 22 must be adjusted before charging is started.

After the vehicle is stopped at the predetermined stop position in the power supply equipment 10 to charge the secondary battery 25, the vehicle-mounted controller 26 wirelessly informs the power source controller 14 that the vehicle-mounted controller 26 is to adjust the secondary matching unit 22. After determining that the power source controller 14 has received the information, the vehicle-mounted controller 26 adjusts the secondary matching unit 22 by controlling the secondary variable capacitors 27, 28. After the power source controller 14 determines that the vehicle-mounted controller 26 is to adjust the secondary matching unit 22, the power source controller 14 turns on the high-frequency power source 11 and starts electric power transmission by the output for charging the secondary battery 25.

The vehicle-mounted controller 26 determines the SOC of the secondary battery 25 based on a detection signal from the SOC detecting section. The vehicle-mounted controller 26 then adjusts the secondary matching unit 22 with reference to the impedance of the secondary matching unit 22, which corresponds to the SOC of the second battery 25. When the vehicle-mounted controller 26 adjusts the secondary matching unit 22, the electric power output from the high-frequency power source 11 cannot be efficiently transmitted to the secondary side, and thus the reflected electric power from the secondary side is great until such adjustment of the secondary matching unit 22 is completed. However, in the first embodiment, a reflected electric power detecting section 11a is mounted in the high-frequency power source 11 and detects the reflected electric power. If the reflected electric power is great, the power source controller 14 decreases the output of the high-frequency power source 11. Then, through adjustment of the secondary matching unit 22 by the vehicle-side controller 26, efficient electric power transmission from the primary-side resonance coil 13b to the secondary-side resonance coil 21b is ensured even when the secondary matching unit 22 is adjusted.

When the vehicle-mounted controller 26 completes adjustment of the secondary matching unit 22, or, in other words, when matching is accomplished between the secondary-side resonance coil 21b and the rectifier 23, the vehicle-mounted controller 26 informs the power source controller 14 that the adjustment of the secondary matching unit 22 is complete and sends a command signal for adjustment of the primary matching unit 12 to the power source controller 14.

In response to the command signal, the power source controller 14 adjusts the primary matching unit 12 by controlling the primary variable capacitors 15, 16. When completing adjustment of the primary matching unit 12, the power source controller 14 informs the vehicle-mounted controller 26 that the adjustment of the primary matching unit 12 is complete and starts to transmit the electric power for charging the secondary battery 25.

In this manner, the high-frequency power source 11 of the power supply equipment 10 supplies AC voltage at the resonance frequency to the primary coil 13a. This causes the primary-side resonance coil 13b to transmit the electric power to the secondary-side resonance coil 21b in a non-contact manner. The electric power received by the secondary-side resonance coil 21b is sent to the charger 24 through the secondary matching unit 22 and the rectifier 23 to charge the secondary battery 25, which is connected to the charger 24. The vehicle-mounted controller 26 determines whether charging is completed based on, for example, the time that has elapsed after the voltage of the secondary battery 25 reaches a predetermined value. When the secondary battery 25 is fully charged, the mounted-vehicle controller 26 sends a charging completion signal to the power source controller 14. In response to the charging completion signal, the power source controller 14 ends the electric power transmission. If the output of the high-frequency power source 11 is increased before matching is completed between the secondary-side resonance coil 21b and the rectifier 23 in adjustment of the primary matching unit 12 by the power source controller 14, electric power cannot be supplied efficiently to the secondary side and thus increases the reflected electric power. However, in the first embodiment, the power source controller 14 adjusts the primary matching unit 12 after matching is completed for the secondary matching unit 22. This ensures efficient transmission of the electric power from the primary-side coil, which is the primary coil device 13, to the secondary-side coil, which is the secondary coil device 21.

The first embodiment has the advantages described below.

(1) The power supply equipment 10 has the AC power source, which is the high-frequency power source 11, and the primary-side resonance coil 13b, which receives electric power from the AC power source. The power supply equipment 10 also includes the primary matching unit 12 arranged between the AC power source and the primary-side resonance coil 13b and the primary matching unit adjusting section for adjusting the primary matching unit 12, which is the power source controller 14. The movable body equipment 20 has the secondary-side resonance coil 21b, which receives the electric power from the primary-side resonance coil 13b, the rectifier 23 for rectifying the electric power received by the secondary-side resonance coil 21b, the charger 24, which receives the electric power rectified by the rectifier 23, and the secondary battery 25 connected to the charger 24. The movable body equipment 20 also includes the secondary matching unit 22, which is arranged between the secondary-side resonance coil 21b and the rectifier 23, and the secondary matching unit adjusting section for adjusting the secondary matching unit 22. The secondary matching unit adjusting section is the vehicle-mounted controller 26. The resonance type non-contact power supply system has the control section (the control means) for controlling the primary matching unit adjusting section and the secondary matching unit adjusting section such that, when the secondary battery 25 is charged, the secondary matching unit 22 is adjusted first and then the primary matching unit 12 is adjusted after adjustment of the secondary matching unit 22. As a result, in the resonance type non-contact power supply system having the matching units on both the power supply side and the power reception side of the first embodiment, the electric power is transmitted efficiently from the primary-side coil to the secondary-side coil when the system charges the load.

(2) The movable body equipment 20 has the control section for controlling the order of adjustment between the primary matching unit 12 and the secondary matching unit 22. In the first embodiment, the control section is the vehicle-mounted controller 26. The power source controller 14 adjusts the primary matching unit 12 in response to a command for adjustment of the primary matching unit 12 from the vehicle-mounted controller 26 serving as the control section. Accordingly, in the first embodiment, adjustment of the primary matching unit 12 is prevented from being started disadvantageously before adjustment of the secondary matching unit 22 is completed.

(3) The vehicle-mounted controller 26 determines the SOC of the secondary battery 25 based on a detection signal input from the SOC detecting section. The vehicle-mounted controller 26 then adjusts the secondary matching unit 22 with reference to the impedance of the secondary battery 25, which corresponds to the SOC of the secondary battery 25. Accordingly, in the first embodiment, the secondary matching unit 22 is adjusted in a short period of time compared to, for example, a case in which the secondary matching unit 22 is adjusted without checking the SOC of the secondary battery 25.

(4) The primary matching unit 12 is a π-type matching unit configured by the two primary variable capacitors 15, 16 and the single primary inductor 17. Accordingly, the impedance of the primary matching unit 12 may be adjusted roughly by adjusting one of the variable capacitors (for example, the primary variable capacitor 15). Then, the impedance of the primary matching unit 12 is adjusted finely by adjusting the other one of the variable capacitors (for example, the primary variable capacitor 16). This facilitates adjustment of the impedance of the primary matching unit 12.

Similarly, the secondary matching unit 22 is a π-type matching unit configured by the two secondary variable capacitors 27, 28 and the single secondary inductor 29. Accordingly, the impedance of the secondary matching unit 22 may be adjusted roughly by adjusting one of the variable capacitors (for example, the secondary variable capacitor 27). Then, the impedance of the secondary matching unit 22 is adjusted finely by adjusting the other one of the variable capacitors (for example, the secondary variable capacitor 28). This facilitates adjustment of the impedance of the secondary matching unit 22.

A second embodiment of the present invention will now be described. In the second embodiment, the basic configuration of the power supply equipment 10 and the basic configuration of the movable body equipment 20 are identical to those of the first embodiment. However, the second embodiment is different from the first embodiment in terms of a method for adjusting the secondary matching unit 22. Specifically, the program representing the adjustment procedure for the secondary matching unit 22 stored in the vehicle-mounted controller 26 of the second embodiment is different from the corresponding program of the first embodiment. The same or like reference numerals are given to components of the second embodiment that are the same as or like corresponding components of the first embodiment and detailed description of the components is omitted herein.

In the first embodiment, the electric power output from the high-frequency power source 11 at the start of adjustment of the secondary matching unit 22 is equal to the output at the start of charging of the secondary battery 25. However, in the second embodiment, when the secondary matching unit 22 is adjusted, the power supply equipment 10 initiates electric power output in a state where the output from the high-frequency power source 11 is less than the output at the start of charging. Afterwards, the power supply equipment 10 sequentially increases the output from the high-frequency power source 11 in multiple steps. Specifically, the vehicle-mounted controller 26 starts adjustment of the secondary matching unit 22 with the output from the high-frequency power source 11 maintained low. When the adjustment of the secondary matching unit 22 is completed with the output maintained low, the vehicle-mounted controller 26 informs the power source controller 14 that the first cycle of adjustment of the secondary matching unit 22 is complete. In response to the information sent from the vehicle-mounted controller 26, the power source controller 14 increases the output from the high-frequency power source 11 by the amount corresponding to one of the steps. This allows the vehicle-mounted controller 26 to perform a second cycle of adjustment of the secondary matching unit 22. Afterwards, the vehicle-mounted controller 26 and the power source controller 14 cooperate in this manner to sequentially increase the output from the high-frequency power source 11. Eventually, adjustment of the secondary matching unit 22 by the vehicle-mounted controller 26 is performed with the electric power output from the high-frequency power source 11 increased to the output at the start of charging of the secondary battery 25. As has been described, by wirelessly informing the power source controller 14 of the adjustment status of the secondary matching unit 22, the vehicle-mounted controller 26 causes the power source controller 14 to change the state of the output from the high-frequency power source 11. Specifically, the vehicle-mounted controller 26 gradually increases, in multiple steps, the output from the high-frequency power source 11 from a value less than the output at the start of charging of the secondary battery 25 to the value at the start of the charging. The vehicle-mounted controller 26 thus adjusts the secondary matching unit 22 in accordance with each of the steps for increasing the output from the high-frequency power source 11. In other words, the vehicle-mounted controller 26 indirectly controls the high-frequency power source 11 through the power source controller 14 such that the output from the high-frequency power source 11 is increased to the output at the start of charging of the secondary battery 25 sequentially by multiple steps. As a result, in the second embodiment, the high-frequency power source 11 is prevented from outputting a great amount of electric power before matching is accomplished between the secondary-side resonance coil 21b and the rectifier 23 when adjustment of the secondary matching unit 22 is performed.

The second embodiment has the advantage described below in addition to the advantages (1) to (4) of the first embodiment.

(5) When adjusting the secondary matching unit 22, the vehicle-mounted controller 26 controls the high-frequency power source 11 and the secondary matching unit adjusting section such that, when the secondary matching unit 22 is adjusted, such adjustment of the secondary matching unit 22 is started in a state where the output from the high-frequency power source 11 is less than the output at the start of charging. The vehicle-mounted controller 26 then controls the high-frequency power source 11 and the secondary matching unit adjusting section to adjust the secondary matching unit 22 such that the output from the high-frequency power source 11 is increased to the output at the start of charging of the secondary battery 25 consecutively in a sequence of multiple steps. Accordingly, the second embodiment restricts the amount of the electric power transmitted inefficiently from the primary coil device 13 to the secondary coil device 21 in a period before completion of adjustment of the secondary matching unit 22 for each of the steps for increasing the output from the high-frequency power source 11. As a result, in the second embodiment, electric power is transmitted efficiently from the primary coil device 13 to the secondary coil device 21, compared to, for example, a case in which adjustment of the secondary matching unit 22 is performed with the electric power output from the high-frequency power source 11 maintained at the level for the start of charging of the secondary battery 25.

The present invention is not restricted to the illustrated embodiments but may be embodied in the modified forms described below.

The charger 24 may include a DC-DC converter for converting the direct current that has been rectified by the rectifier 23 into the voltage suitable for charging the secondary battery 25. In this case, the vehicle-mounted controller 26 is configured to control the switching device of the DC-DC converter of the charger 24 at the time when the secondary battery 25 is charged. The state of matching changes also in correspondence with the duty cycle of the DC-DC converter. Accordingly, the vehicle-mounted controller 26 must adjust the duty cycle of the DC-DC converter of the charger 24 first and then adjusts the secondary matching unit 22. Finally, the vehicle-mounted controller 26 adjusts the primary matching unit 12 through the power source controller 14. This further effectively decreases the electric power transmitted inefficiently from the primary coil, which is the primary coil device 13, to the secondary coil device 21 at the time when the primary matching unit 12 is adjusted.

The control section, which controls the primary matching unit adjusting section and the secondary matching unit adjusting section such that, when the secondary battery 25 is charged, the secondary matching unit 22 is adjusted first and then the primary matching unit 12 is adjusted afterward, does not necessarily have to be mounted in the movable body equipment 20. In other words, the control section may be arranged not in the movable body equipment 20, but in the power supply equipment 10. For example, the power source controller 14 may have a control program for performing the functions of the control section.

By the method for adjusting the matching units of the resonance type non-contact power supply system for when the system performs charging, the secondary matching unit 22 is adjusted first and then the primary matching unit 12 is adjusted after adjustment of the secondary matching unit 22 when the secondary battery 25 is charged. Accordingly, the control section, which controls the primary matching unit adjusting section and the secondary matching unit adjusting section such that the secondary matching unit 22 is adjusted first and then the primary matching unit 12 is adjusted afterward when the secondary battery 25 is charged, does not necessarily have to be mounted in either the power supply equipment 10 or the movable body equipment 20. For example, the power supply equipment 10 may include an adjustment starting command output section (for example, a command switch) for outputting an adjustment starting command for the primary matching unit 12. In this case, after adjustment of the secondary matching unit 22 is completed when the secondary battery 25 is charged, the user (the driver) of the vehicle manipulates the adjustment starting command output section to operate the power source controller 14 to start adjusting the primary matching unit 12.

The vehicle serving as the movable body is not restricted to one requiring a driver, but may be an unmanned carrier.

The movable body is not restricted to a vehicle but may be a robot.

If the movable body is an unmanned carrier or a robot, the control section for controlling the secondary matching unit adjusting section of the movable body equipment 20, which is mounted in the movable body, outputs a secondary matching unit adjustment completion signal to the power source controller 14 when adjustment of the secondary matching unit 22 is accomplished by controlling the secondary matching unit adjusting section. In response to the secondary matching unit adjustment completion signal, the power source controller 14 controls the primary matching unit adjusting section to start adjustment of the primary matching unit 12. Also in this case, the control section for controlling the order of operation for the primary matching unit adjusting section and the secondary matching unit adjusting section does not necessarily have to be mounted in either the power supply equipment 10 or the movable body equipment 20.

The resonance type non-contact power supply system does not necessarily have to include all of the primary coil 13a, the primary-side resonance coil 13b, the secondary coil 21a, and the secondary-side resonance coil 21b to supply electric power from the power supply equipment 10 to the movable body equipment 20 in a non-contact manner. That is, the resonance type non-contact power supply system must include at least the primary-side resonance coil 13b and the secondary-side resonance coil 21b. In other words, instead of configuring the primary coil device 13 with the primary coil 13a and the primary-side resonance coil 13b, the primary coil device 13 may be formed without the primary coil 13a. In this case, the primary-side resonance coil 13b must be connected to the high-frequency power source 11 through the primary matching unit 12. Also, the secondary coil device 21 does not necessarily have to include both the secondary coil 21a and the secondary-side resonance coil 21b but may be formed without the secondary coil 21a. In this case, the secondary-side resonance coil 21b has to be connected to the rectifier 23 through the secondary matching unit 22. However, a power supply system that has the primary coil 13a, the primary-side resonance coil 13b, the secondary coil 21a, and the secondary-side resonance coil 21b is easier to adjust to a resonance state. Also, the system having all of the components is easier to maintain in the resonance state even when the primary-side resonance coil 13b is spaced from the secondary-side resonance coil 21b by a great distance. As a result, it is more preferable to employ the power supply system that has all the components.

The primary matching unit 12 and the secondary matching unit 22 are restricted to the $\pi$ type, may be a T-type or an L-type.

Neither the primary matching unit 12 nor the secondary matching unit 22 is restricted to the configuration having two variable capacitors and an inductor. That is, each of the matching units 12, 22 may be configured with a variable inductor serving as an inductor. Alternatively, each of the matching units 12, 22 may be configured with a variable inductor and two non-variable capacitors.

The axes of the primary coil 13a, the primary-side resonance coil 13b, the secondary-side resonance coil 21b, and the secondary coil 21a are not restricted to be horizontal or vertical. That is, the axes of these coils may be inclined with respect to the horizontal direction.

The charger 24 does not necessarily have to include a booster circuit. For example, the AC electric current output from the secondary coil device 21 may be simply rectified by the rectifier 23 before being charged in the secondary battery 25.

The diameter of the primary coil 13a and the diameter of the secondary coil 21a do not necessarily have to be equal to the diameter of the primary-side resonance coil 13b and the diameter of the secondary-side resonance coil 21b, respectively. In other words, the diameters of the primary and secondary coils 13a, 21a may be either greater or smaller than the diameters of the primary-side and secondary-side resonance coils 13b, 21b.

Neither the primary-side resonance coil 13b nor the secondary-side resonance coil 21b is restricted to the power cable wound in a helical shape. That is, these resonance coils 13b, 21b may a spiral shape in a plane.

The capacitor C connected to the primary-side resonance coil 13b and the capacitor C connected to the secondary-side resonance coil 21b may be omitted. However, the configuration having the capacitors C connected to the corresponding primary-side and secondary-side resonance coils 13b, 21b has a low resonance frequency compared to, for example, a configuration without a capacitor C. Also, if the resonance frequency is the same, the sizes of the primary-side resonance coil 13b and the secondary-side resonance coil 21b can be reduced in the configuration having the capacitors C connected to the corresponding resonance coils 13b, 21b compared to the configuration without the capacitors C.

DESCRIPTION OF THE REFERENCE NUMERALS

10 . . . power supply equipment, 11 . . . high frequency power source serving as AC power source, 12 . . . primary matching unit, 13b . . . primary-side resonance coil, 14 . . . power source controller functioning as a primary matching unit adjusting section, 20 . . . movable body equipment, 21b . . . secondary-side resonance coil, 22 . . . secondary matching unit, 23 . . . rectifier, 24 . . . charger, 25 . . . secondary battery, 26 . . . vehicle-mounted controller serving as secondary matching unit adjusting section and control section.

The invention claimed is:

1. A resonance type non-contact power supply system comprising a power supply equipment and movable body equipment, wherein
the power supply system includes an AC power source and a primary-side resonance coil for receiving electric power from the AC power source,
the movable body equipment includes:
a secondary-side resonance coil for receiving the electric power from the primary-side resonance coil;
a rectifier for rectifying the electric power received by the secondary-side resonance coil; and
a secondary battery to which the electric power rectified by the rectifier is supplied,
the power supply equipment further includes:
a primary matching unit arranged between the AC power source and the primary-side resonance coil;
a primary matching unit adjusting section for adjusting the primary matching unit; and
an electric power detecting section,
the movable body equipment further includes:
a secondary matching unit arranged between the secondary-side resonance coil and the rectifier; and
a secondary matching unit adjusting section for adjusting the secondary matching unit,
the resonance type non-contact power supply system also includes a control section mounted in one of the power supply equipment and the movable body equipment, and
the control section controls the primary matching unit adjusting section and the secondary matching unit adjusting section such that, when the secondary battery is charged, the secondary matching unit is adjusted first and then the primary matching unit is adjusted after the secondary matching unit is adjusted,
wherein through the adjustment of the secondary matching unit, the power supply equipment is adapted to decrease the output of the AC power source based on the reflected electric power detected by the electric power detecting section.

2. The system according to claim 1, wherein the control section controls the AC power source and the secondary matching unit adjusting section such that, when the secondary matching unit is adjusted, adjustment of the secondary matching unit is started with an output of the AC power source maintained less than an output at the start of charging, and then the output of the AC power source is increased to the output at the start of charging of the secondary battery in multiple steps.

3. The system according to claim 1, wherein the control section is mounted in the movable body equipment.

4. The system according to claim 1, wherein each of the matching units is a π-type matching unit including two variable capacitors and an inductor arranged between the variable capacitors.

5. The system according to claim 1, wherein the movable body is a vehicle.

6. A method for adjusting a matching unit when a resonance type non-contact power supply system performs charging, wherein
the resonance type non-contact power supply system has power supply equipment and movable body equipment,
the power supply equipment includes:
an AC power source;
a primary-side resonance coil;
a primary matching unit; and
an electric power detecting section,
the movable body equipment includes:
a secondary-side resonance coil for receiving electric power from the primary-side resonance coil;
a secondary matching unit;
a rectifier for rectifying the electric power received by the secondary-side resonance coil; and
a secondary battery to which the electric power rectified by the rectifier is supplied, and
the method comprises, when the secondary battery is charged, adjusting the secondary matching unit first and then adjusting the primary matching unit after the secondary matching unit is adjusted; and
through the adjustment of the secondary matching unit, decreasing the output of the AC power source based on the reflected electric power detected by the electric power detecting section.

7. The method according to claim 6, wherein
the primary matching unit and the secondary matching unit are each a π-type matching unit including two variable capacitors and an inductor arranged between the capacitors, and
the method further comprises adjusting the primary matching unit and the secondary matching unit by adjusting the capacity of the variable capacitors.

* * * * *